June 16, 1959 G. D. BRUCE ET AL 2,891,172
SWITCHING CIRCUITS EMPLOYING JUNCTION TRANSISTORS
Filed Sept. 30, 1954 3 Sheets-Sheet 1

INVENTORS
GEORGE D. BRUCE
ROBERT A. HENLE
BY
P. E. Henninger
ATTORNEY

INVENTORS
GEORGE D. BRUCE
ROBERT A. HENLE
BY
Y. E. Henninger
ATTORNEY

SWITCHING CIRCUITS EMPLOYING JUNCTION TRANSISTORS

Filed Sept. 30, 1954 3 Sheets-Sheet 3

INVENTORS
GEORGE D. BRUCE
ROBERT A. HENLE

BY P. E. Henninger

ATTORNEY

United States Patent Office 2,891,172

Patented June 16, 1959

2,891,172

SWITCHING CIRCUITS EMPLOYING JUNCTION TRANSISTORS

George D. Bruce, Wappingers Falls, and Robert A. Henle, Hyde Park, N.Y., assignors to International Business Machines Corporation, New York, N.Y., a corporation of New York Application September 30, 1954, Serial No. 459,322

3 Claims. (Cl. 307—88.5)

This invention relates to switching circuits employing junction transistors, and especially to switching circuits which are useful in high speed digital computers.

A switching circuit may be defined as a circuit wherein changes in the impedance between output terminals take place suddenly, with accompanying current and potential changes, as a result of changes in the impedance of a translating device, e.g., a vacuum tube or a transistor, connected in the circuit.

A junction transistor consists of a body of semi-conductive material having a central region in which one type of current carrier structure predominates (commonly the predominating carriers in the central region are electrons and the material is spoken of as N-type), and two end regions, wherein the other common type of current carrier structure predominates (the other common type of current carrier is termed a 'hole" and the semi-conductive material in those end portions is called P-type material). A base electrode is in electrically conductive contact with the central region, and emitter and collector electrodes are in contact with the respective end regions.

Junction transistors are to be contrasted with point contact transistors, which employ a body which is uniformly of N- or P-type material, with two point contacts (emitter and collector electrodes) and one wide area contact (base electrode) engaging the body. Junction transistors are more stable than point contact transistors. Their characteristics are more nearly linear and do not change as much with time or with temperature variations. Furthermore, their current-carrying capacity is greater than that of point contact transistors.

High speed digital computers commonly work with a series of pulses of electric current or potential, each pulse representing a digit. The pulses used may be square wave pulses or peaked wave pulses. It is desirable to employ in such computers circuits which will not distort the pulses. In other words, the output waves should be just as square or just as peaked as the input waves. It is also desirable to have the signal pulses fixed as to their potential or current magnitude.

It is sometimes desirable in such a computer to invert a square wave. Specifically, it may be desired to connect a first circuit having a normal negative output potential on which are superimposed positive square wave signal pulses to a second circuit which utilizes a normally positive input potential with superimposed negative square wave pulses. In such a case it is necessary to invert the signals from the first circuit, i.e. reverse the polarities of their potentials, before impressing them on the second component circuit. A circuit which performs such an inverting operation is commonly referred to as an inverter circuit.

Computers commonly utilize circuits termed logical circuits, which have multiple sets of input terminals and a single set of output terminals. A logical circuit produces a pulse at its output terminals only in response to a predetermined combination of signals at its input terminals. For example, a type of logical circuit known as an And circuit produces a signal at its output terminals only when signals are received simultaneously at all of its input terminals. Another type of circuit, commonly termed an Or circuit, produces an output pulse in response to an input pulse at any one of its sets of input terminals.

The present invention is directed to circuits employing junction transistors and which, in various embodiments, may be employed as inverter or logical circuits.

An object of the invention is to provide improved circuits of the type described employing junction transistors.

A further object of the invention is to provide circuits of the type described having improved characteristics as to the wave form and magnitude of the output pulses.

The foregoing and other objects of the invention are attained herein through the use of a basic circuit which itself functions as an inverter circuit. This inverter circuit utilizes a junction transistor, with a grounded emitter and a signal input into the base. In a typical circuit, a PNP transistor is used, being normally conductive, and cut off by a positive impulse transmitted to the base, thereby changing the collector potential in a negative sense, which change is transmitted to an output terminal.

Between the input terminal and the base there may be provided an impedance coupling including either a resistor, a capacitor, or a parallel resistor and capacitor. Alternatively, a direct conductive coupling may be used. For many purposes, it is preferred to use the parallel resistor and capacitor input coupling.

Means are provided biasing the base to a potential which tends to hold the transistor cut off. A clamping circuit is provided for the collector electrode, to establish the negative peak value of the output pulses.

Two of the inverter circuits just described may be coupled together to provide a logical circuit, which may be either an And or an Or circuit. A modification of the single inverter circuit may be employed as a type of logical circuit termed an And Not circuit. A further modification of the inverter circuit may be employed as a pullover circuit.

Other objects and advantages of the invention will become apparent from a consideration of the following specification and claims, taken together with the accompanying drawings.

Figure 1:
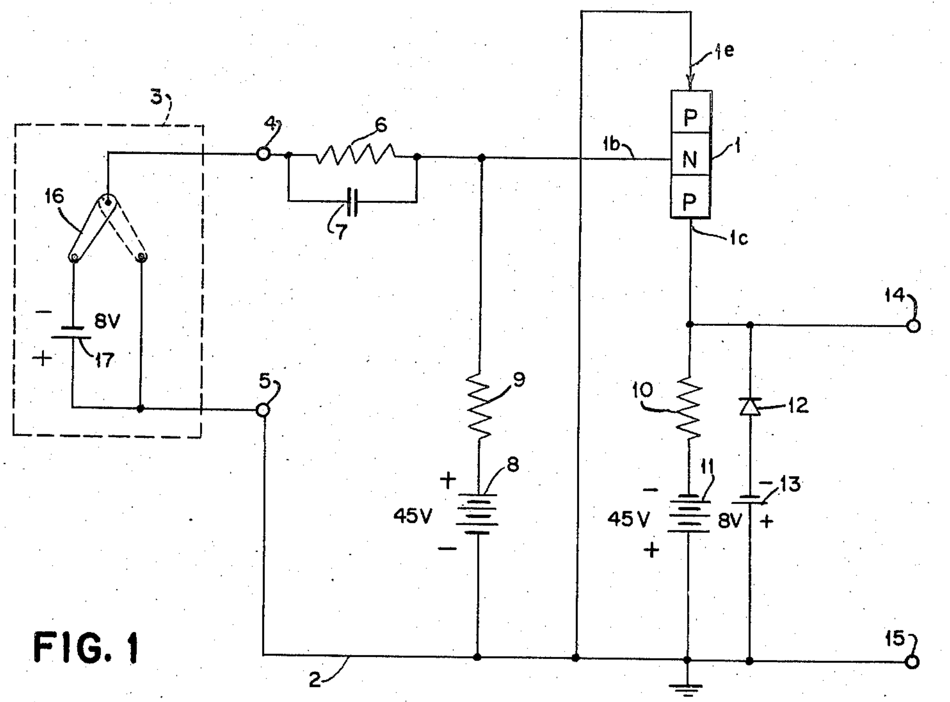
Fig. 1 is a wiring diagram of an inverter circuit embodying the invention.
Figure 2:
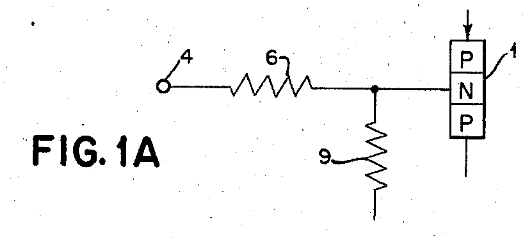
Figs. 2 and 3 are graphical illustrations of the current and potential waves occurring at different points in the circuits of Figs. 1 and 1A.
Figure 2:
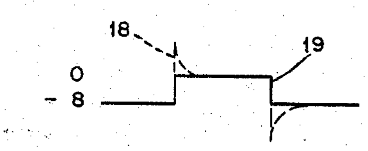
Figure 3:
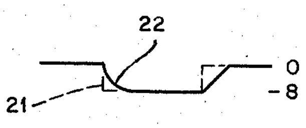

In the drawings:

Fig. 1A is a fragmentary wiring diagram showing a modification of a portion of the circuit of Fig. 1;

*Figs. 1 to 3*

Fig. 1 illustrates an inverter circuit including a PNP junction transistor 1, having an emitter electrode 1*e*, a base electrode 1*b*, and a collector electrode 1*c*. Emitter 1*e* is connected to a grounded wire 2. An input signal generator 3 is connected to a pair of input terminals 4 and 5. Input terminal 4 is connected through a resistor 6 and a parallel capacitor 7 to the base electrode 1*b*. Input terminal 5 is connected to grounded wire 2.

Means for biasing the base electrode 1*b* positively is provided, including a battery 8 and a resistor 9 connected in series between grounded wire 2 and base 1*b*. Collector 1*c* is connected to a load circuit including a load resistor 10 and a battery 11 in series, the opposite terminal of battery 11 being connected to grounded wire 2.

A clamping circuit is provided for limiting the minimum negative potential of collector 1*c*. This clamping circuit comprises a diode 12 and a battery 13 connected in series between collector electrode 1*c* and grounded wire 2.

A pair of output terminals 14 and 15 are connected respectively to collector 1*c* and to grounded wire 2.

The signal generator 3 may have any conventional form. In order to illustrate an example, it is shown very simply as comprising a switch 16 movable between the full-line position shown, in which a battery 17 is connected in series between the input terminals 4 and 5, and a dotted-line position in which the input terminals 4 and 5 are directly connected together. Operation of switch 16 from its full-line position to its dotted-line position and return produces at the terminal 4 a square wave input signal illustrated graphically at 19 in Fig. 2.

Fig. 1A illustrates a possible modification of Fig. 1, that modification consisting simply of omitting the capacitor 7.

*Operation of Figs. 1 to 3*

When the switch 16 in signal generator 3 is in the position shown, the base electrode 1*b* is maintained at a negative potential by the combined effects of batteries 8, 11 and 17. The emitter electrode 1*e* is connected to ground, and is therefore continuously at a potential of 0 volts. The emitter being positive with respect to the base 1*b*, the transistor 1 is conductive, so that a substantial current flows in the load circuit of the transistor. The potential of the collector electrode is below ground only by the potential drop through the transistor, which at this time is very small, so that the collector electrode is at a negative potential of a few tenths of a volt, which may be for practical purposes considered as 0 volts. A substantial current also flows through the base electrode 1*b* producing a potential drop across resistor 6, which potential drop is effective to charge the capacitor 7 with its right-hand terminal positive. This potential drop across resistor 6 must be less than the terminal voltage of battery 17, i.e., in the illustrated example, 8 volts, since base 1*b* is to be held negative.

Now assume that the signal generator 3 transmits a positive-going square wave pulse to the base 1*b*. In the arrangement shown for the signal generator 3, this is accomplished by throwing the switch 16 to its dotted-line position. When this positive-going square wave is first impressed across treminals 4 and 5, it adds in series with the potential due to the charge on capacitor 7. The potential at the base 1*b* is therefore suddenly increased, following the curve 18 appearing in dotted-lines in Figure 2 and the base swings positive. The high positive potential applied to base 1*b* swings it above the potential of the emitter 1*e*, thereby cutting off the flow of current in the transistor 1. The flow of current through resistor 6 stops, and the charge across the capacitor 7 leaks off through resistor 6, the potential of base 1*b* falling substantially to the potential of input terminal 4, which is indicated by the curve 19 in Fig. 2. When the current flow in transistor 1 cuts off, the collector electrode 1*c* then swings negatively, tending to assume the potential of the negative terminal of battery 11. The negative swing of collector 1*c* is, however, limited by the clamping diode 12 and the battery 13. The diode 12 starts to conduct in its forward direction as soon as the collector 1*c* falls to a potential of −8 volts, thereby limiting the negative swing of the potential of the collector electrode to that value. The output signal has the form and potential values indicated by the curve 21 in Fig. 3.

When the input signal pulse terminates, for example by returning the switch 16 to its full-line position, the capacitor 7 has no charge and acts as a low impedance between base 1*b* and the negative battery terminal, thereby swinging the base electrode 1*b* negative rapidly and turning the transistor on quickly, whereupon the conditions in the circuit return to the status first described above.

The bias to the base 1*b* provided by battery 8 and resistor 9 result in improved operation of the circuit at elevated temperatures. Such temperatures tend to increase the Off state collector current, and this tendency is counteracted by the bias, making the circuit less sensitive to temperature.

If the capacitor 7 is omitted, as indicated in Fig. 1A, then the transistor does not cut off or turn on as quickly as when the capacitor is used. The output wave then has the form illustrated at 22 in Fig. 3, having a gradual beginning and ending instead of a vertical square beginning and ending. The full lines in Figs. 2 and 3 respectively show the input signal and the output signal when capacitor 7 is not used, and the dotted lines in those figures respectively show the base and collector (output) potentials when capacitor 7 is used.

It may therefore be seen that the circuit of Fig. 1 inverts signals supplied by the signal generator 3, reversing the polarity of the potentials of the input signals, while maintaining their wave form the same as that of the input signals and establishing the maximum value of the output signal at a fixed predetermined point. If the wave form is not important, the capacitor 7 may be omitted as in Fig. 1A.

Figure 4:
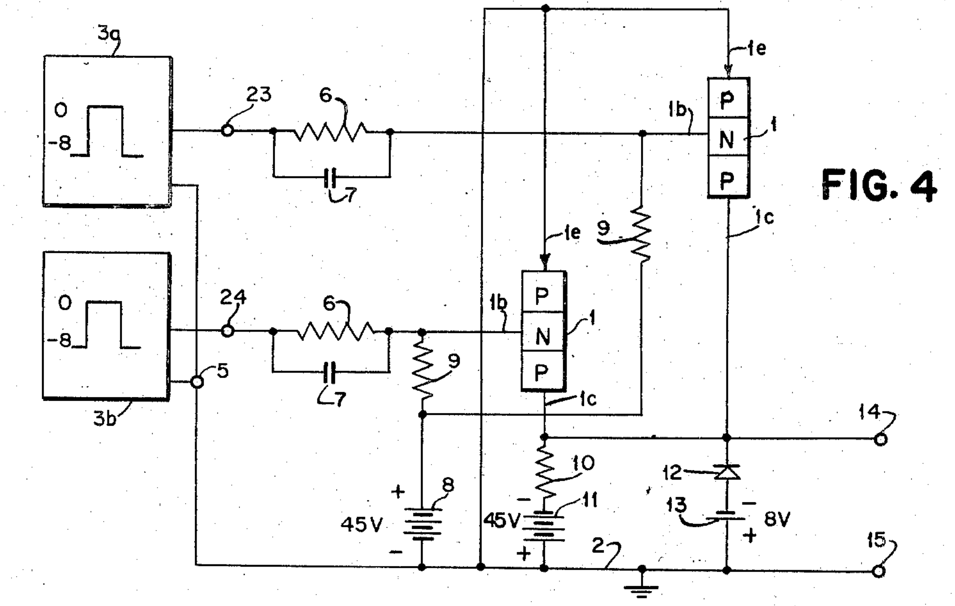
Fig. 4 is a wiring diagram of a logical circuit embodying certain features of the invention.

*Fig. 4*

In this figure, circuit elements which correspond to their counterparts in Fig. 1 have been given the same reference numerals, and will not be further described. It may be seen that the circuit of Fig. 4 comprises two transistors 1 having a common load circuit connected between their two collector electrodes 1*c* and a grounded wire 2. The transistors 1 respectively receive signals from separate signal generators 3*a* and 3*b* which may be the same as the signal generator 3 of Fig. 1. There are three input terminals in the circuit of Fig. 4, a common grounded input terminal 5, and separate input terminals 23 and 24 for the two transistors.

*Operation of Fig. 4*

The operation of each individual transistor in Fig. 4 is the same as described above in connection with Fig. 1. Since both transistors are normally on, both must be cut off in order to produce a signal at the output terminals. In other words, this circuit operates as an And circuit. If a signal is received simultaneously at both input terminals, then a signal is produced at the output terminals. If a signal is received at only one input terminal, current flow through its associated transistor is cut off but neither the current flow through resistor 10 nor the potential drop across it varies substantially, since the impedance of resistor 10 is high as compared to the base-collector impedances of the transistors. The signal at the output terminals remains substantially the same as it was when no signal at all was received at the input.

As is well known in the art of logical circuits, an And circuit may be used as an Or circuit, depending only upon the logical values assigned to the presence or absence of signals at the various terminals.

Figure 5:
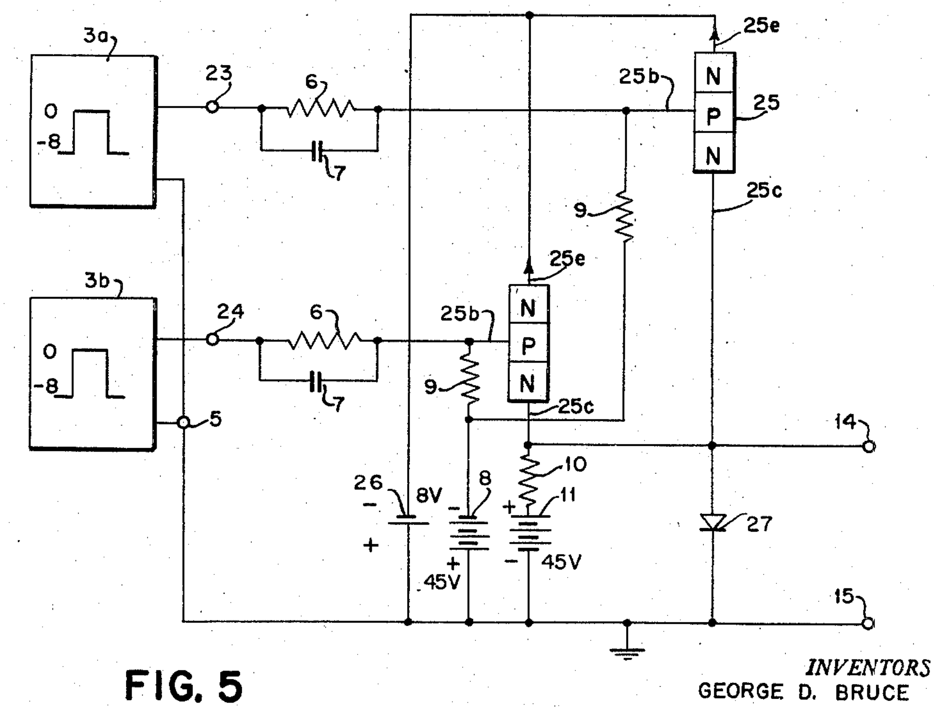
Fig. 5 is a wiring diagram of a modified form of logical circuit embodying the invention.

*Fig. 5*

The circuit in this figure is a logical circuit like that of Fig. 4, but modified in certain respects. This circuit uses two NPN transistors 25, each having an emitter electrode 25*e*, a base electrode 25*b*, and a collector electrode 25*c*.

Again, the circuit elements in Fig. 5 which are the same as those of the preceding figures have been given the same reference numerals and will not be further described.

The emitters 25*e* of both the transistors 25 are biased negatively by a battery 26. The collector electrodes 25*c* of the transistors 25 are clamped at a positive maximum of 0 volts by a diode 27 connected between the collector electrodes and ground. No clamping battery is employed.

Since NPN transistors are employed rather than PNP transistors, all the batteries are reversed in Fig. 5 as compared to their polarities in the preceding figures. Note, however, that the polarities of the input signals remain the same.

*Operation of Fig. 5*

The transistors 25 are both normally off, and when signals are received from the signal generators 3*a* and 3*b*, they are turned on. If a signal is received from only one generator, then its transistor is turned on. The signal appearing at the output terminals is substantially the same whether one or both transistors are turned on. This is typical Or circuit operation.

The operation of each individual transistor circuit in Fig. 5 is somewhat different than the operation of the corresponding circuit in Fig. 1. In one of the transistors of Fig. 5, under the no signal condition, the emitter is at —8 volts, while the base is connected through resistor 9 to the —45 volt terminal of battery 8 and is also connected through a resistor 6 to the —8 volt input terminal 4. The net effect of these base connections is to establish the base 25*b* at a potential just slightly negative with respect to emitter 25*e*, and the transistor is cut off. The potential drop across resistor 6 is substantially zero, and capacitor 7 is not charged.

When a positive signal is received from the generator, the 0 volt potential is quickly transmitted through capacitor 7 to base 25*b*, making the base positive with respect to emitter 25*e*, and turning the transistor on. When the transistor turns on, the current flow through the base 25*b* produces a potential drop through resistor 6 of slightly less than 8 volts. The base 25*b* cannot go very far positive with respect to emitter 25*e*, because of the low forward base-emitter impedance. The resistor 6 then functions as a current-limiting resistor, determining the maximum current flow through transistor 25. (If the current tends to increase so that the drop across resistor 6 is more than 8 volts, then the transistor will start to cut off.) The collector 25*c* then goes to a potential of —8 volts, substantially the same as the emitter. Capacitor 7 becomes charged to a potential of about 8 volts, with its right hand terminal negative. When the input signal terminates the base 25*b* goes immediately to —16 volts, becoming sufficiently negative with respect to emitter 25*e* to cut the transistor off quickly. The collector potential at this time is limited to ground potential by the action of the diode 27. If the collector tends to go above ground potential, then the impedance of diode 27 falls to substantially zero, establishing the collector at ground potential. The charge on capacitor 7 leaks off through resistor 6, and normal no signal conditions are again established.

In view of the fact that the circuit of Fig. 5 produces an inverted output signal, it may be referred to as a Not Or logical circuit rather than as an Or circuit. The Not indicates the inversion of the output potential with respect to the input potential.

Figure 6:
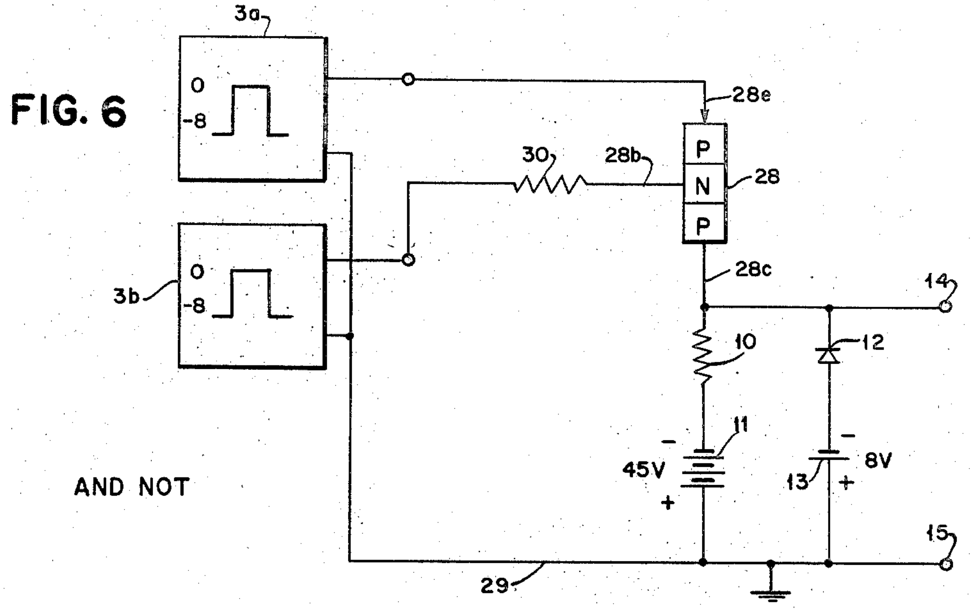
Fig. 6 is a wiring diagram of a logical circuit of the And Not type embodying certain features of the invention.

*Fig. 6*

This figure illustrates the inverter circuit of Fig. 1 as modified to form an And Not logical circuit. The circuit includes a PNP transistor 28 having an emitter 28*e*, a base 28*b*, and a collector 28*c*. The emitter 28*e* is connected to grounded wire 29 through a signal generator 3*a*. Base 28*b* is connected to grounded wire 29 through a resistor 30 and a signal generator 3*b*. The circuit elements connected to the collector 28*c* are the same as those connected to the collector 1*c* in Fig. 1 and have been given the same reference numerals.

*Operation of Fig. 6*

Under no signal conditions both the base and the emitter are —8 volts, the transistor is cut off, and the output is at —8 volts, being clamped there by battery 13 and diode 12. If a signal appears at the base but not on the emitter, the transistor remains non-conductive, since the base is then more positive than the emitter. If a signal appears on the base and emitter simultaneously, the potential difference between the base and the emitter remains the same as under normal conditions and there is no change at the output.

If a signal appears on the emitter 28*e*, while there is no signal at the base 28*b* changing the emitter potential to ground, then the emitter becomes more positive than the base and the transistor conducts.

Summarizing, the transistor 28 conducts only when there is a signal applied from signal generator 3*a* and no signal from generator 3*b*. In other words, a signal at the output terminals indicates a signal from emitter generator 3*a* and not from base generator 3*b*.

Figures 7, 7A:
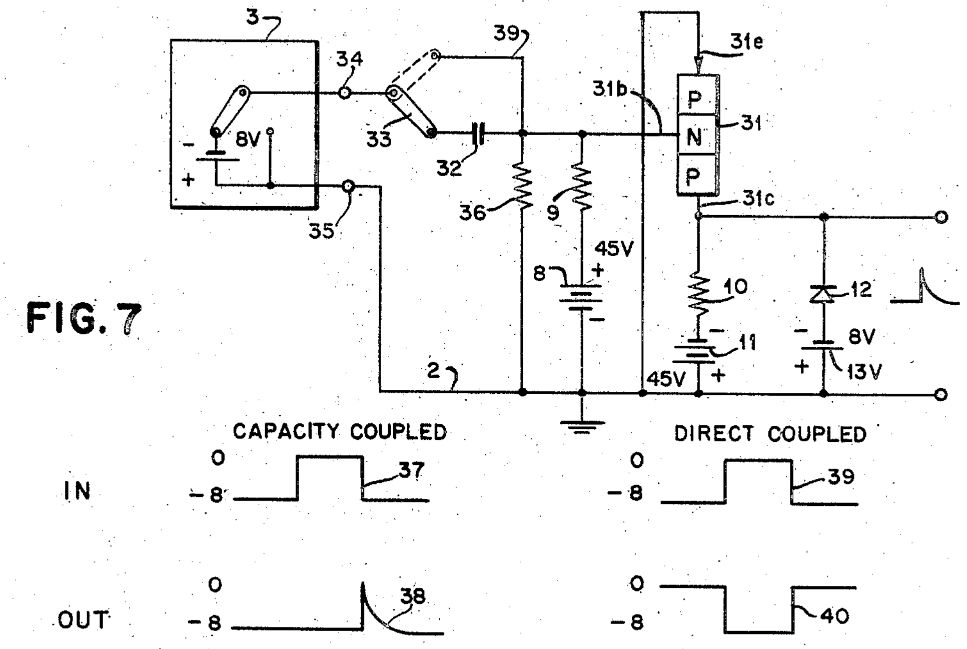
Fig. 7 is a wiring diagram of a modified inverter circuit embodying still other features of the invention.
Fig. 7A is a graphical illustration of potential waves occurring at selected points in the circuit of Fig. 7.

*Fig. 7*

This figure illustrates an inverter circuit which may be used with capacity input coupling, in which case it changes a square wave input pulse to a peaked wave output, or it may be used with direct input coupling, in which case it inverts the input signal. The circuit includes a PNP junction transistor 31 having an emitter electrode 31*e*, a base electrode 31*b*, and a collector electrode 31*c*. The emitter electrode 31*e* is connected to grounded wire 2. Base electrode 31*b* is connected through resistor 9 and a biasing battery 8 to the grounded wire 2. Base 31*b* is also connected through a capacitor 32 and a switch 33 to an input terminal 34. Alternatively, switch 33 may be thrown to the dotted line position shown, when capacitor 32 is shunted by wire 39. Another input terminal 35 is connected to the grounded wire 2. Signal generator 3 is connected to the input terminals 34 and 35.

*Operation of Fig. 7*

Consider first the operation of the circuit of Fig. 7 which takes place with capacity input coupling, i.e., with the switch 33 in full-line position shown. Under no signal conditions, —8 volts is applied to the input terminal 34, and capacitor 32 becomes charged with a potential of substantially —8 volts, with its left hand terminal negative. The base 31*b* is biased substantially to a potential of plus 1 volt, by the battery 8. The transistor is cut off.

When a signal appears at the input terminals 34 and 35, it swings the base potential 31*b* farther positive, due to the potential stored on capacitor 32. However, this potential now leaks off through resistor 36, so that after a short time there is no potential across capacitor 32. When the input signal thereafter goes negative, it biases the base 31*b* negative and a charging current for capacitor 32 flows through resistor 36. The base 31*b* then falls to a potential below the ground potential of the emitter and the transistor conducts until the capacitor 32 is charged sufficiently to swing the base positive again. The rate of conduction through the transistor starts out at a high level because substantially the full negative voltage of the signal generator 3 is initially applied to the base. This voltage gradually drops to zero as the capacitor 32 charges. The current flow through transistor 31 therefore starts off at a high rate and gradually falls to zero.

Fig. 7A shows in curve 37 the wave form of the input signal and in curve 38 the wave form of the output signal. Curve 38 may have a flat top or "dwell" before falling, if the signal applied to the base is more than enough to drive the collector into "saturation." Then, the output will stay positive until the base current through capacitor 32 becomes small enough so that the transistor begins to return to the Off state. The duration of the flat top or dwell depends on the size of capacitor 32 and the current gain of the transistor.

The circuit of Fig. 7 arranged for capacitive input coupling, may be used effectively as an interstage coupling circuit for a ring circuit, as illustrated, for example in the copending application of Olin L. MacSorley, Serial No. 459,388, filed September 30, 1954, now U.S. Patent No. 2,882,423, granted April 14, 1959.

When the switch 33 is thrown to its dotted-line position, the capacitor 32 is shunted by a wire 39. In that case, the circuit responds directly to the input signals and is an inverter circuit. The input signal then has the form shown by the curve 39 in Fig. 7A and the output signal is as shown at 40.

Where NPN junction transistors are employed in the foregoing circuits, it will be readily understood that PNP junction transistors could be employed with equal facility by reversing the polarities of all batteries, and vice versa.

The following table shows by way of example particular values for the potentials of the various batteries and for the impedances of the various resistors and capacitors, in circuits which have been operated successfully. In some cases, these values are also shown in the drawing. These values are set forth by way of example, only, and the invention is not limited to these values nor to any of them. No values are given for the asymmetric impedance elements which may be considered to have substantially no impedance in their forward direction and substantially infinite impedance in their reverse direction.

*Table I*

| | | |
|---|---|---|
| Resistor **6** | kilohms | 20 |
| Capacitor **7** | mmf | 680 |
| Battery **8** | volts | +15 |
| Resistor **9** | kilohms | 240 |
| Resistor **10** | do | 3 |
| Battery **11** | volts | −15 |
| Battery **13** | do | −5 |
| Battery **17** | do | −5 |
| Resistor **30** | kilohms | 20 |
| Capacitor **32** | mmf | 680 |
| Resistor **36** | kilohms | 10 |

What is claimed is:

1. A logical circuit comprising a plurality of inverter circuits, each including a junction transistor having an emitter electrode, a collector electrode, and a base electrode, a common load circuit connected between the collector and base electrodes of all said inverter circuits, clamp means for limiting the minimum potential at a point in said load circuit, common means maintaining all said emitter electrodes at a fixed potential, common means tending to hold all the base electrodes at a potential such that the transistors are all in a first predetermined state characterized by relatively low conductivity, separate input means for each transistor shiftable between a no-signal condition and a signal condition in which it transmits to the base an input signal potential having a polarity and magnitude to shift said transistor to a second state characterized by relatively high conductivity, said common load circuit including a load impedance high as compared to the base-collector impedances of the transistors, so that the current flow therethrough is low when all said input means are in said no-signal condition and shifts to a substantially higher value when any of said input means is in its signal condition.

2. A logical circuit as defined in claim 1, in which said junction transistors are PNP transistors, said means for maintaining all the emitter electrodes at a fixed potential comprises means connecting the emitter electrodes to ground, and said clamp means comprises means for limiting the variation of the collector electrode potential in a negative sense.

3. A logical circuit as defined in claim 1, in which said transistors are NPN transistors, said means maintaining all the emitter electrodes at a fixed potential comprises means for biasing said emitter electrodes to a potential negative with respect to ground, and said clamping means includes means for limiting the positive potential of the collector electrode at ground potential.

References Cited in the file of this patent

UNITED STATES PATENTS

| | | |
|---|---|---|
| 2,594,336 | Mohr | Apr. 29, 1952 |
| 2,627,039 | MacWilliams | Jan. 27, 1953 |
| 2,644,895 | Lo | July 7, 1953 |
| 2,644,897 | Lo | July 7, 1953 |
| 2,655,609 | Shockley | Oct. 13, 1953 |
| 2,695,993 | Haynes | Nov. 30, 1954 |
| 2,728,857 | Sziklai | Dec. 27, 1955 |
| 2,760,087 | Felker | Aug. 21, 1956 |